United States Patent
Maszara

(10) Patent No.: US 6,680,240 B1
(45) Date of Patent: Jan. 20, 2004

(54) SILICON-ON-INSULATOR DEVICE WITH STRAINED DEVICE FILM AND METHOD FOR MAKING THE SAME WITH PARTIAL REPLACEMENT OF ISOLATION OXIDE

(75) Inventor: Witold P. Maszara, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/178,542

(22) Filed: Jun. 25, 2002

(51) Int. Cl.[7] .............. H01L 21/30; H01L 21/46; H01L 21/84; H01L 21/00
(52) U.S. Cl. .............. 438/455; 438/459; 438/149
(58) Field of Search .............. 438/455, 459, 438/149, 243–246, 386–389

(56) References Cited

U.S. PATENT DOCUMENTS

| 4,604,162 A | * | 8/1986 | Sobczak | 438/410 |
| 5,270,265 A | * | 12/1993 | Hemmenway et al. | 438/404 |
| 5,683,934 A | | 11/1997 | Candelaria | |
| 5,811,283 A | * | 9/1998 | Sun | 438/244 |
| 6,045,625 A | * | 4/2000 | Houston | 148/33.3 |
| 6,245,600 B1 | * | 6/2001 | Geissler et al. | 438/149 |
| 6,319,333 B1 | | 11/2001 | Noble | |
| 6,403,482 B1 | * | 6/2002 | Rovedo et al. | 438/689 |
| 6,426,252 B1 | * | 7/2002 | Radens et al. | 438/243 |
| 6,455,369 B1 | * | 9/2002 | Forster et al. | 438/249 |
| 6,506,620 B1 | * | 1/2003 | Scharf et al. | 438/52 |
| 6,524,929 B1 | * | 2/2003 | Xiang et al. | 438/424 |
| 2002/0046985 A1 | * | 4/2002 | Daneman et al. | 216/2 |
| 2002/0047158 A1 | * | 4/2002 | Park et al. | 257/347 |
| 2002/0055244 A1 | * | 5/2002 | Burbach et al. | 438/586 |
| 2002/0113288 A1 | * | 8/2002 | Clevenger et al. | 257/513 |
| 2002/0115244 A1 | * | 8/2002 | Park et al. | 438/152 |

* cited by examiner

Primary Examiner—John F. Niebling
Assistant Examiner—Jennifer M. Kennedy

(57) ABSTRACT

A silicon-on-insulator (SOI) device with a strained silicon film has a substrate, and a buried oxide layer on the substrate. Silicon islands are formed on the buried oxide layer, the silicon islands being separated from each other by gaps. The buried oxide layers has recesses directly under the gaps. A material fills the recesses and the gaps, this material being different from the material forming the buried oxide layer. The material induces a net amount of strain in the silicon islands, thereby modifying the electrical properties of carriers in the silicon film and improving device performance.

8 Claims, 3 Drawing Sheets

SILICON-ON-INSULATOR DEVICE WITH STRAINED DEVICE FILM AND METHOD FOR MAKING THE SAME WITH PARTIAL REPLACEMENT OF ISOLATION OXIDE

FIELD OF THE INVENTION

The present invention relates to the field of semiconductor manufacturing, and more particularly, to the formation of strained device film for silicon-on-insulator (SOI) devices.

BACKGROUND OF THE INVENTION

The advantages of silicon-on-insulator (SOI) technology for complementary metal-oxide-semiconductor (CMOS) integrated circuits (ICs) are well documented. Typically, SOI technology reduces undesired p-n junction capacitance between source/drain and a substrate by approximately 25% as compared to other conventional techniques for CMOS ICs. Furthermore, CMOS ICs fabricated with SOI technology have less active current consumption while maintaining device performance equivalent to that of similar devices formed on bulk-silicon substrates. Other advantages of SOI technology include suppression of the short channel effect, suppression of the body-effect, high punch-through immunity, and reduced latch-up and soft errors. As the demand increases for battery-operated equipment, SOI technology is becoming increasingly more popular due to the low power requirements at high speeds of SOI devices.

There are many different techniques for formation of SOI wafers. These include SIMOX, which is separation by implanted oxygen technology. Wafer bonding is another technique for forming an isolation layer in a substrate. Forming silicon islands through a series of etch and oxidation steps can provide lateral isolation structure.

In standard MOSFET technology, the channel length and gate dielectric thickness are reduced to improve current drive and switching performance. Carrier mobility of a MOSFET device is an important parameter because of its direct influence on output current and switching performance. Accordingly, another way to increase device performance is to enhance the channel mobility. This enhancement has been provided in certain devices by straining the silicon film. A net strain can be provided by compressive stress of the silicon film, or tensile stress of the silicon film.

It is desirable to provide the isolation advantages of SOI technology and silicon islands, yet also provide the improved device performance achieved through enhancement of carrier mobility.

SUMMARY OF THE INVENTION

There is a need for providing a strained silicon film in an SOI device having silicon islands to increase the device performance by enhancing the carrier mobility in the silicon film.

This and other needs are met by embodiments of the present invention which provide a method of forming strained device film comprising the steps of etching recesses in a buried oxide layer of a silicon-on-insulator (SOI) structure having a substrate, a buried oxide layer on the substrate, and a silicon layer on the buried oxide layer. The silicon layer has trenches, and the etching of recesses in the buried oxide layer include etching through the trenches in the silicon layer. The recesses in the buried oxide layer and the trenches are filled with a material that induces a net amount of strain in the silicon layer.

By replacing some of the buried oxide layer with other material, a net amount of strain in the silicon layer may be induced to provide a desired amount of and type of stress. For example, in certain embodiments, nitride is deposited into the recesses and the buried oxide layer and the trenches in the silicon layer. Changing the material will change the amount and type of stress, such as either tensile or compressive stress, that produces the net amount of strain in the silicon layer. Hence, the present invention improves the device performance by enhancing the channel mobility in the SOI devices that are created.

The earlier stated needs are also met by embodiments of the present invention which provide a silicon-on-insulator (SOI) device with strained silicon film, comprising a substrate and a buried oxide layer on the substrate. Silicon islands are provided on the buried oxide layer. The silicon islands are separated from each other by gaps. The buried oxide layer has recesses directly under the gaps. A material fills the recesses and the gaps, this material inducing a net amount of strain in the silicon islands.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves problems related to the improvement of device performance for SOI devices. The present invention achieves this, in part, by the partial replacement of the isolation oxide underneath and between the silicon islands by a different material. In certain embodiments of the invention, an undercutting etch is performed through the gaps between the silicon islands and the silicon layer to etch the buried oxide layer in an undercutting manner. Following the etch of the buried oxide layer, a material is deposited within the gaps and the recesses formed in the buried oxide layer. The material is chosen to provide a desired amount of stress, either tensile or compressive, into the silicon islands to induce a net amount of strain in the silicon film. The strained silicon has enhanced carrier mobility, thereby improving the device performance of devices formed on the strained silicon.

Figure 1:
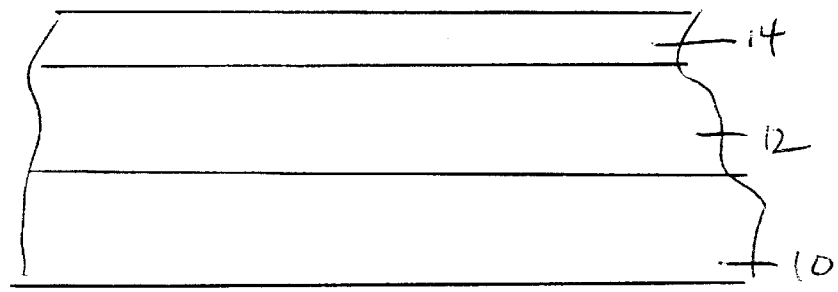
FIG. 1 schematic, cross-section of a precursor for a silicon-on-insulator (SOI) device constructed in accordance with embodiments of the present invention.

FIG. 1 depicts a schematic, cross-section of a precursor for a SOI device, constructed in accordance with embodiments of the present invention. The precursor includes a substrate 10, which may be a silicon substrate, for example, on top of which is formed a buried oxide layer 12. A silicon film, or layer 14, is formed on the buried oxide layer 12. The precursor may be formed in a conventional manner.

Figure 2:
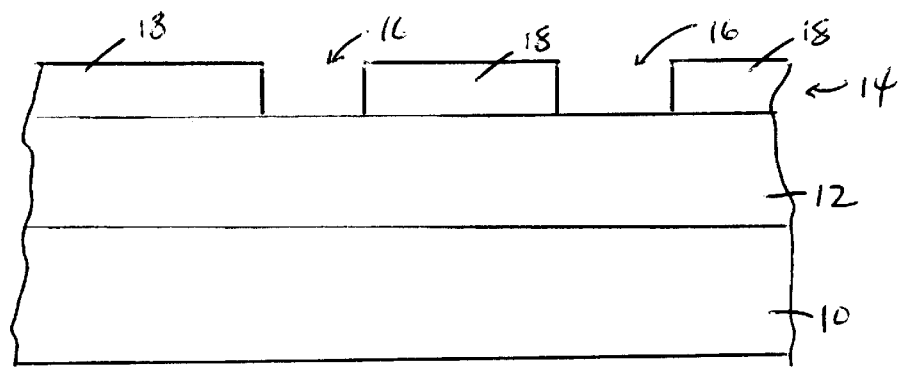
FIG. 2 depicts the structure of FIG. 1 after trenches have been etched into the silicon layer to form silicon islands.

In FIG. 2, trenches 16 have been etched into the silicon layer 14. A conventional etching technique and chemistry is employed to etch the silicon layer 14 and stop on the buried oxide layer 12. The trenches 16 separate the SOI layer 14 into silicon islands 18. The etching performed is a conventional anisotropic etch, for example, that produces vertical sidewalls on the silicon islands 18. The anisotropic etch may be a reactive ion etch (RIE) that directionally etches the silicon layer 14. The width of the silicon islands 18 is selected in accordance with conventional techniques.

Figure 3:
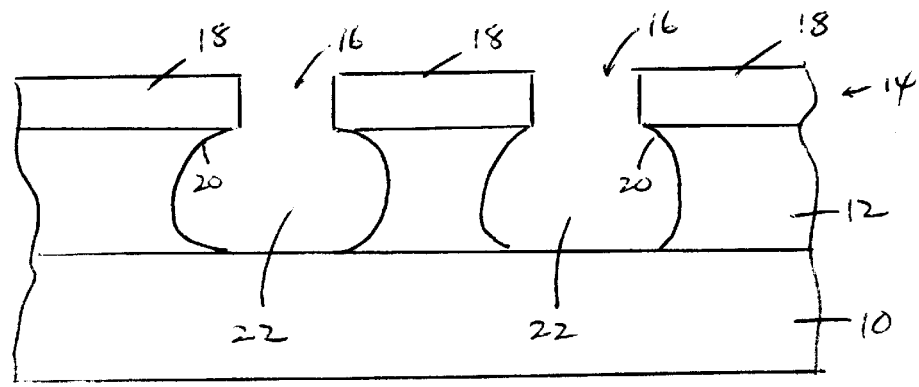
FIG. 3 shows the structure of FIG. 2 after the buried oxide layer has been etched with an undercutting etch, in accordance with embodiments of the present invention.

Following the etching of the trenches 16 into the silicon layer 14 to create the islands 18, the buried oxide layer 12 is etched with an undercutting etch process. In FIG. 3, the results of the undercutting etch is depicted. A conventional etching technique may be performed to etch the buried oxide layer 12. A moderately anisotropic technique may be employed such that undercutting (as indicated at 20) is exhibited in the buried oxide layer 12. Hence, with the etching thus performed, recesses 22 are created within the buried oxide layer 12. The recesses 22 include portions that are directly beneath the trenches 16 in the silicon oxide layer 14, and portions that are underneath the silicon islands 18. The etching proceeds through the trenches 16 into the buried oxide layer 12, and the etching is allowed to proceed until the undercuts 20 are produced in the buried oxide layer 12. An isotropic process may also be employed, or a moderately anisotropic process may be employed alternatively. The amount of undercutting may be controlled to influence the amount of strain in the silicon islands 18. In other words, in addition to selecting the material to be deposited, the size of the recess 22 created in the buried oxide layer 12 will have an effect on the strain induced in the silicon islands.

Having formed the recesses 22 in the buried oxide layer 12, and the trenches 16 between the silicon islands 18, a new material is introduced that replaces the oxide that has been etched from the buried oxide layer 12. A conventional deposition technique, such as plasma enhanced chemical vapor deposition (PECVD) may be employed to deposit the material 24 into the recesses 22 and the trenches 16. The material is selected according to the material's intrinsic properties that will affect the net amount of strain induced in the silicon islands 18. As an exemplary material, nitride may be used to fill the recesses 22 and the gaps formed by the trenches 16. Due to its intrinsic properties, nitride provides a tensile stress in the depicted structure of FIG. 4. Other materials may be chosen that provide different amounts of tensile stress, or a different type of stress, such as compressive stress. Those of ordinary skill in. the art may select the appropriate material based upon the intrinsic properties of the material to produce a desired amount and type of stress.

Figure 4:
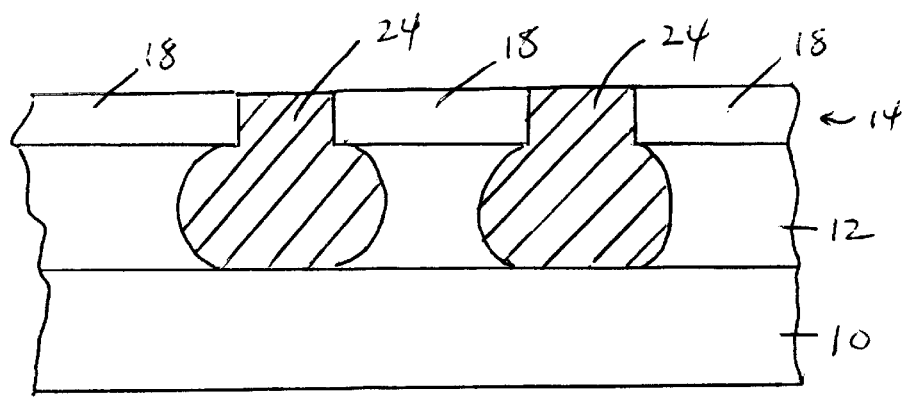
FIG. 4 shows the structure of FIG. 3 following the deposition and planarization of another material, in accordance with embodiments of the present invention.

The material 24 is planarized by a conventional planarization technique, such as chemical mechanical polishing (CMP), to produce the structure of FIG. 4. The stress provided by the replacement material 24 in the structure of FIG. 4 induces a net amount of strain in the silicon islands 18. This net amount of strain modifies the electrical properties of carriers in the silicon film in the silicon islands 18. Hence, the device performance of the SOI devices that are subsequently formed will be improved.

Figure 5:
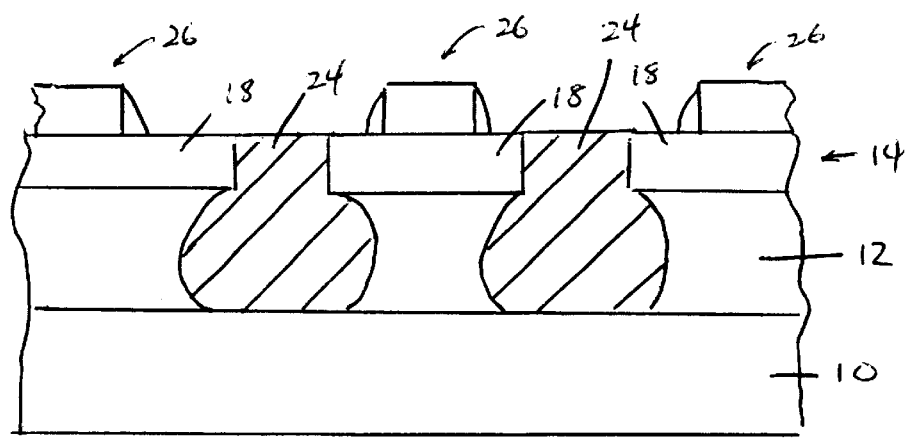
FIG. 5 depicts the structure of FIG. 4 after completed devices are formed on the silicon islands, in accordance with embodiments of the present invention.

FIG. 5 shows the structure of FIG. 4 after semiconductor devices 26 are formed on the silicon islands 18. Due to the strained silicon of the silicon islands 18, induced by the replacement material 24 in the buried oxide layer 12 and between the silicon islands 18, there is improved channel mobility in the devices 26 so that the devices exhibit increased performance.

These materials are exemplary only, as other materials may be used without departing from the spirit and the scope of the present invention.

Another aspect provides a method for reducing gate dielectric leakage by differential gate dielectric thicknesses. Gate dielectric leakage is the most around the drain and source areas, while in the middle of the channel, it is four or five orders of magnitude less. Since the tunneling is exponentially dependent on dielectric thickness, a thicker dielectric is needed at the source/drain edge to suppress gate leakage. A thin dielectric is needed elsewhere to increase gate control of the channel inversion.

After annealing the extension implants, gate oxide is etched from the side in buffered HF solution that has a very controllable etch rate. A lateral etch to the edge of the extension junction is performed. Next, both the gate and the silicon are oxidized at a low temperature (e.g., <750° C. to prevent extension dopant diffusion. Doped polysilicon and n+ Si will oxidize much faster than lightly doped p-channel.

Figure 6:
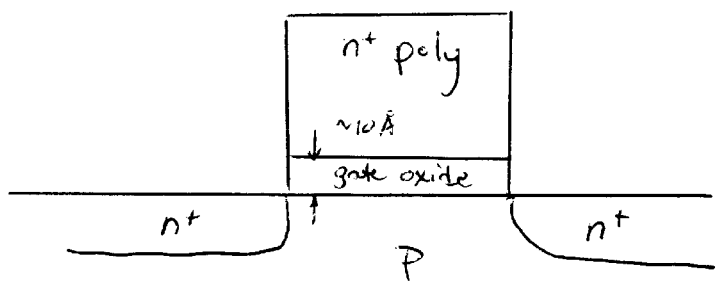
FIGS. 6 and 7 depict a method for reducing gate dielectric leakage by differential gate dielectric thicknesses.
Figure 7:
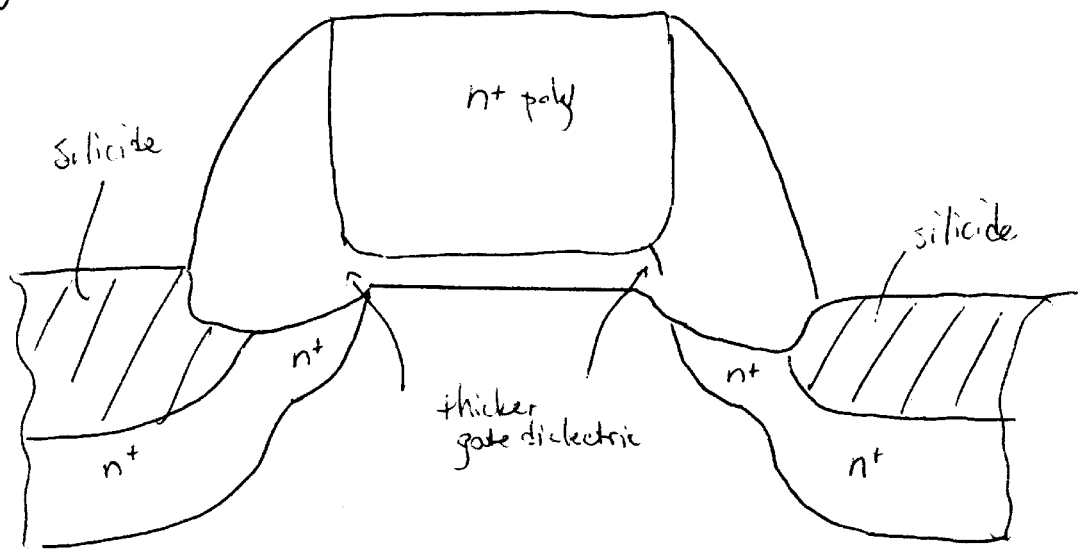

After the oxidation, 25 to 30 Angstroms thick dielectric is formed over the n+ regions. The thickness will drastically reduce large leakage and also reduce Miller capacitance. The process follows by spacer formation, source/drain implant and silicidation. The process is depicted in FIGS. 6 and 7.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of forming strained device film, comprising the steps of:

etching recesses in a buried oxide layer of a silicon-on-insulator (SOI) structure having a substrate, a buried oxide layer on the substrate, and a silicon layer on the buried oxide layer, the silicon layer having trenches, and the etching of recesses in the buried oxide layer including etching through the trenches in the silicon layer and through the buried oxide layer to stop on the substrate; and filling the recesses in the buried oxide layer and the trenches with a material that induces a net amount of strain in the silicon layer.

2. The method of claim 1, wherein the step of etching the recesses includes isotropically etching the buried oxide layer.

3. The method of claim 2, wherein the material is nitride.

4. The method of claim 3, further comprising planarizing after filling the recesses in the buried oxide layer and the trenches.

5. The method of claim 4, further comprising forming semiconductor devices on the silicon layer.

6. The method of claim 1, wherein the net amount of strain induced is compressive.

7. The method of claim 1, wherein the net amount of strain induced is tensile stress.

8. The method of claim 1, wherein the substrate is a bulk SOI wafer.

* * * * *